United States Patent [19]

Ando et al.

[11] Patent Number: 5,084,959
[45] Date of Patent: Feb. 4, 1992

[54] CHIP MOUNTING APPARATUS

[75] Inventors: Tateo Ando, Osaka; Akira Kabeshita, Hirakata, both of Japan

[73] Assignee: Matsushita Electric Industrial Co., Ltd., Osaka, Japan

[21] Appl. No.: 582,613

[22] Filed: Sep. 14, 1990

[30] Foreign Application Priority Data

Sep. 19, 1989 [JP] Japan .................................. 1-243717

[51] Int. Cl.$^5$ ............................................. B23P 19/00
[52] U.S. Cl. ........................................ 29/740; 29/720; 29/833; 29/846
[58] Field of Search ................. 29/740, 846, 833, 848, 29/849, 720

[56] References Cited

U.S. PATENT DOCUMENTS

| | | | |
|---|---|---|---|
| 4,738,025 | 4/1988 | Arnold | 29/833 X |
| 4,912,843 | 4/1990 | Dederer | 29/846 |
| 4,922,434 | 5/1990 | Fule | 29/740 X |
| 4,980,971 | 1/1991 | Bartschat et al. | 29/720 X |

OTHER PUBLICATIONS

IBM Tech. Disclosure Bulletin, vol. 30, No. 3, Aug. 1987, pp. 980-981.
IBM Tech. Discl. Bull., vol. 30, No. 1, Jun. 1987, pp. 228-234 entitled "Surface-Mounted Device Placement".

Primary Examiner—Carl J. Arbes
Attorney, Agent, or Firm—Wenderoth, Lind & Ponack

[57] ABSTRACT

A chip mounting apparatus includes an X-Y robot having a chip mounting head and a substrate position recognizing camera both positioned in an upper arm of the robot apparatus. The chip mounting head is for holding a chip to be mounted. A substrate holding member is for holding a chip mounting substrate and is disposed below the robot. A chip position recognizing camera is also disposed below the robot. The positional relationship between the chip mounting head and the substrate position recognizing camera is equivalent to the positional relationship between a chip mounting position of the chip mounting substrate and the chip position recognizing camera.

2 Claims, 3 Drawing Sheets

CHIP MOUNTING APPARATUS

BACKGROUND OF THE INVENTION

The present invention relates to a chip mounting apparatus having a substrate position recognizing camera and a chip position recognizing camera.

A conventional chip mounting apparatus is described with reference to the accompanying FIG. 3. FIG. 3 is a perspective view showing a conventional chip mounting apparatus. As shown in FIG. 3, an X-Y robot 1 has a chip mounting head 2 and a substrate position recognizing camera 3 mounted side by side. With the movement of the robot 1, the head 2 is positioned above a chip supply section 8, thus extracting a chip 7 from the chip supply section 8 and attaching the extracted chip 7 thereto. Then, with the movement of the robot 1, the head 2 is positioned above a chip position recognizing camera 4 so that the camera 4 reads the coordinate of the chip 7 held by the head 2. Thereafter, with the movement of the robot 1, the camera 3 moves above a chip mounting position 6 of a chip mounting substrate 5 so that the camera 3 reads the coordinate of the chip mounting position 6. Based on the reading results of the cameras 3 and 4, a value for compensating for the positional error of the chip 7 with respect to the reference position of the head 2 is calculated. Then, the robot 1 moves so that the chip 7 extracted and held by the head 2 is correctly placed on the chip mounting position 6 on the substrate 5.

As described above, the conventional chip mounting apparatus individually checks the chip mounting position 6 and the position of the chip 7 extracted and held by the head 2. Thus, the robot 1 moves inefficiently. That is, the time required for the conventional chip mounting apparatus to mount the chip 7 on the chip mounting position 6 is relatively long.

SUMMARY OF THE INVENTION

Accordingly, an essential object of the present invention is to solve the above-described problem of the conventional art and to provide a chip mounting apparatus comprising an X-Y robot capable of mounting a chip on a chip mounting position at a high speed.

In accomplishing these and other objects, according to one aspect of the present invention, there is provided a chip mounting apparatus comprising: an X-Y robot having a chip mounting head and a substrate position recognizing camera both positioned in an upper portion of the apparatus, the chip mounting head for holding a chip; a substrate holding member for holding a chip mounting substrate, the member being disposed below the robot; and a chip position recognizing camera disposed below the robot, wherein the positional relationship between the chip mounting head and the substrate position recognizing camera is equivalent to the positional relationship between a chip mounting position of the chip mounting substrate and the chip position recognizing camera.

By the construction of the aspect of the one present invention, each chip is mounted on only one chip mounting position of each substrate. Since the positional relationship between the chip mounting position and the chip position recognizing camera is equivalent to the positional relationship between the substrate position recognizing camera and the chip mounting head, the recognitions of the chip mounting position on the substrate and the position of the chip held by the head can be accomplished in the same coordinate with respect to the robot. This arrangement allows the robot to move more efficiently. That is, the robot is capable of mounting the chip correctly on the chip mounting position in a shorter period of time.

According to another aspect of the present invention, there is provided the chip mounting apparatus in which the substrate holding member is an X-Y table mounted on a portion, of the apparatus, for holding the chip mounting substrate.

By the construction of the other aspect of the present invention, a chips can be mounted on a plurality of chips mounting positions of the mounting substrate. The mounting substrate is moved by the X-Y table. According to this arrangement, the positional relationship between the substrate position recognizing camera and the chip mounting head is equivalent to the positional relationship between each of a plurality of chips mounting positions and the chip position recognizing camera. Therefore, the recognition of the chip mounting position and that of the position of the chip held by the head can be accomplished in the same coordinate with respect to the robot. This arrangement allows the robot to move more efficiently. That is, the robot is capable of respectively mounting the chips correctly on the chip mounting positions in a shorter period of time.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE EMBODIMENTS

Figure 1:
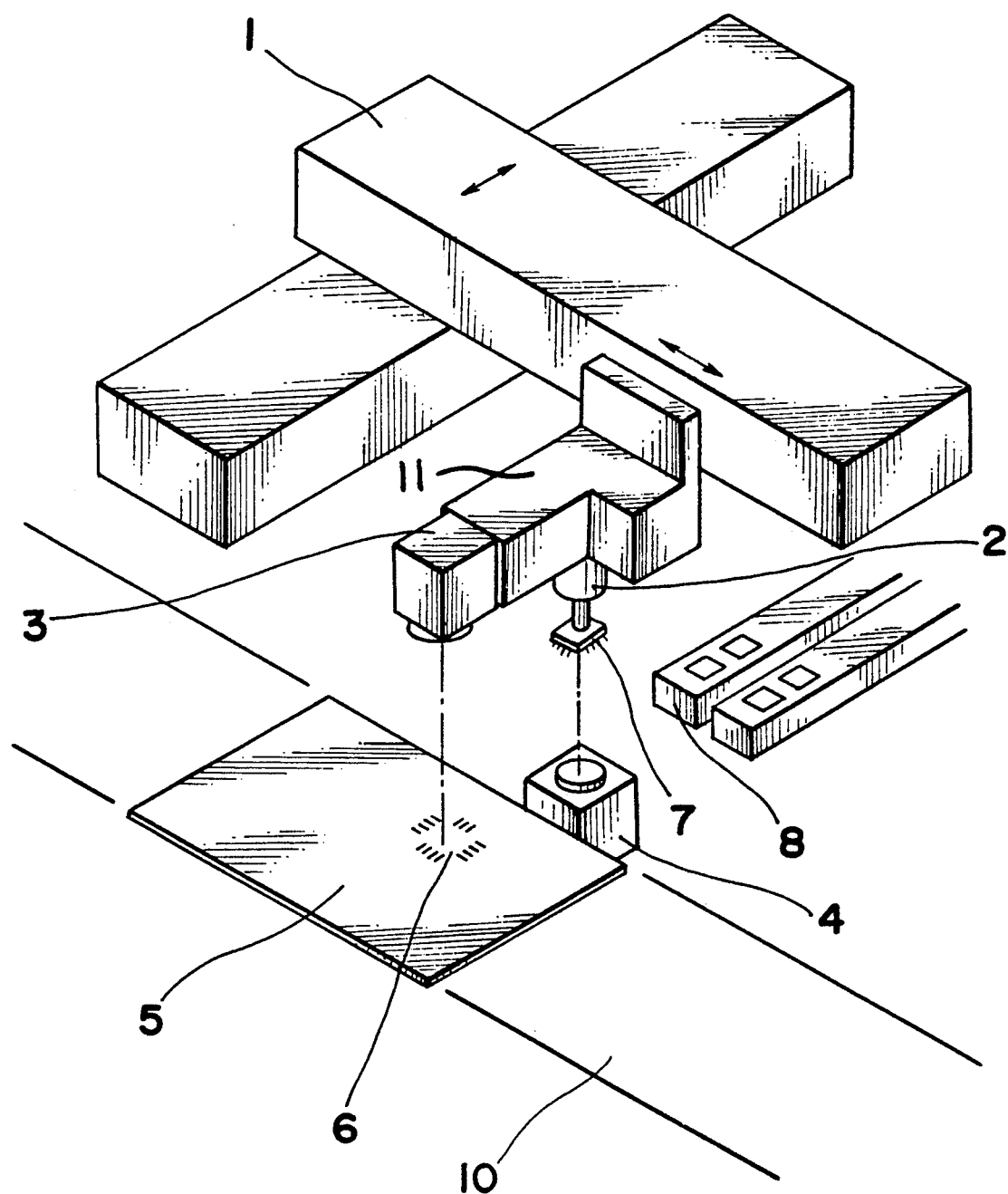
FIG. 1 is a perspective view showing a chip mounting apparatus according to a first embodiment of the present invention.

Before the description of the present invention proceeds, it is to be noted that like parts are designated by like reference numerals throughout the accompanying drawings.

FIG. 1 is a perspective view showing a chip mounting apparatus according to a first embodiment of the present invention. In FIG. 1, reference numeral 1 denotes an X-Y robot capable of moving along x and y directions in x-y coordinates; 2 denotes a chip mounting head fixed to an arm member 11 of the robot 1; 3 denotes a substrate position recognizing camera fixed to the arm member 11 of the robot 1; 4 denotes a chip position recognizing camera arranged below the robot 1; 5 denotes a chip mounting substrate of which a chip 7 is mounted on a chip mounting position 6 and which is arranged below the robot 1 and on a substrate holding member 10; and 8 denotes a chip supply section for supplying the chip 7, which is arranged below the robot 1.

In the first embodiment, when the chip 7 is mounted on one predetermined chip mounting position 6, the positional relationship between the chip mounting position 6 and the chip position recognizing camera 4 is equivalent to the positional relationship between the substrate position recognizing camera 3 and the chip mounting head 2. That is, when the substrate position recognizing camera 3 is positioned above the chip mounting position 6 with the movement of the robot 1, the chip mounting head 2 is positioned above the chip position recognizing camera 4. Therefore, the recognition of the chip mounting position 6 and the position of the chip 7 extracted and held by the head 2 can be simultaneously accomplished in the sam coordinate with respect to the robot 1. This arrangement allows the robot 1 to move more efficiently. That is, the robot 1 is capable of mounting the chip 7 correctly on the chip mounting position 6 in a shorter period of time.

Figure 2:
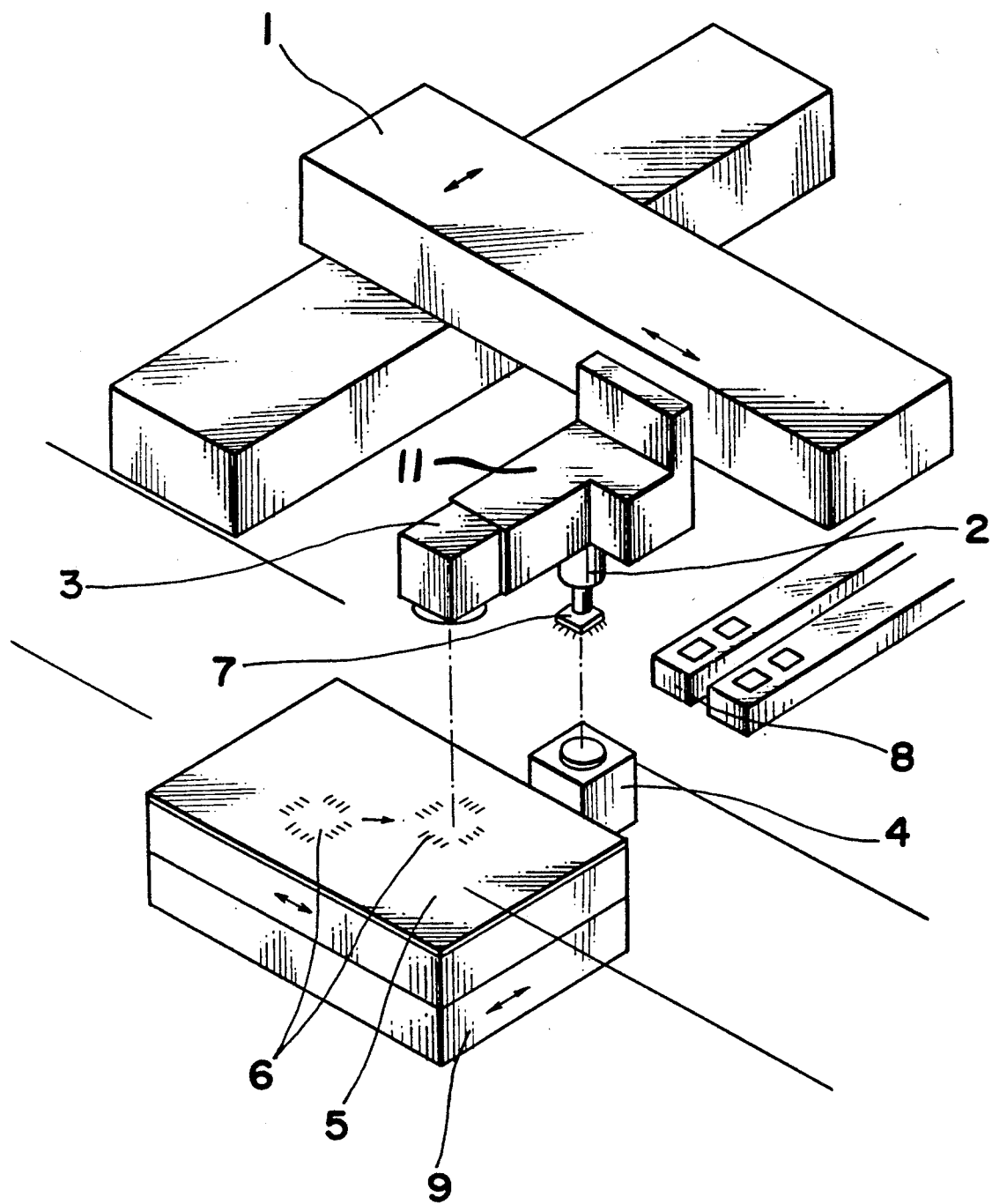
FIG. 2 is a perspective view showing a chip mounting apparatus according to a second embodiment of the present invention.
Figure 3:
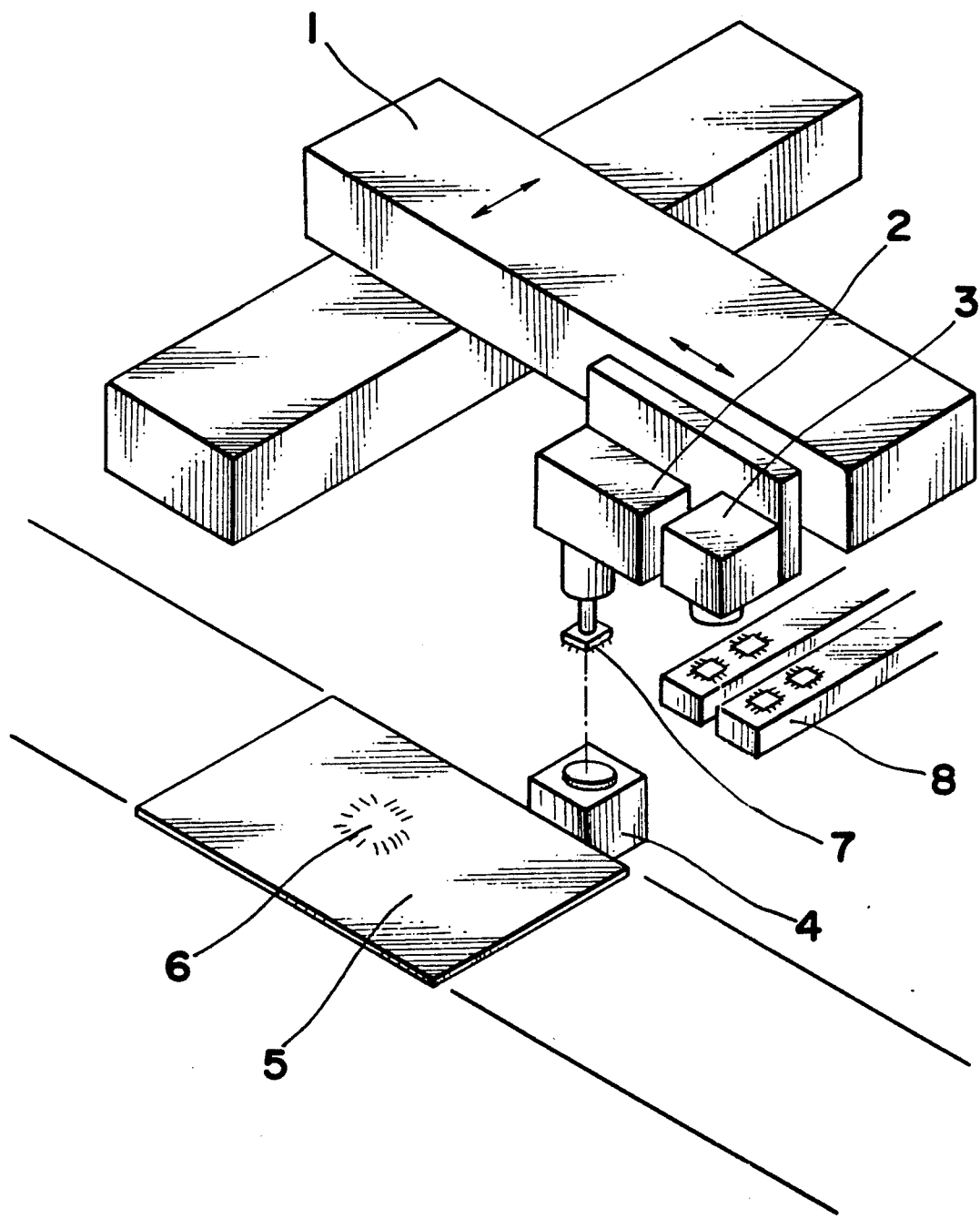
FIG. 3 is a perspective view showing a conventional chip mounting apparatus.

FIG. 2 is a perspective view showing a chip mounting apparatus according to a second embodiment of the present invention.

The second embodiment is differentiated from the first embodiment by installing the chip mounting substrate 5 on an X-Y table 9.

In the second embodiment, the operation and the advantage as described in the first embodiment can be performed. Furthermore, chips can be mounted on a plurality of chip mounting positions 6 of the substrate 5. That is, the position of the chip 7 extracted and held by the head 2 is recognized by the chip position recognizing camera 4. At the same time, the substrate 5 is moved by an X-Y table 9 serving as a substrate holding member so that the substrate position recognizing camera 3 can recognize a plurality of chip mounting positions 6. Therefore, the recognitions of the chip mounting position 6 and the position of the chip 7 extracted and held by the head 2 can be simultaneously accomplished in the same coordinate with respect to the robot 1. This arrangement allows the robot 1 to move more efficiently. That is, the robot 1 is capable of respectively mounting the chips 7 correctly on the chip mounting positions 6 in a short shorter period of time.

Although the present invention has been full described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they departs therefrom.

What is claimed is:

1. A chip mounting apparatus comprising:
    an X-Y robot having an arm member which is movable in X and Y directions relative to a mounting position of the X-Y robot;
    a chip mounting head and a substrate position recognizing camera respectively fixed to the arm member of the X-Y robot;
    a substrate holding member for holding a chip mounting substrate, the substrate holding member being disposed such that a chip mounting position of the chip mounting substrate is spaced from and opposed to the substrate position recognizing camera; and
    a chip position recognizing camera disposed spaced from and opposed to the chip mounting head,
    wherein a positional relationship between the chip mounting head and the substrate position recognizing camera is equivalent to a positional relationship between the chip mounting position of the chip mounting substrate and the chip position recognizing camera, wherein the chip mounting head is in a field of view of the chip position recognizing camera at the same time the chip mounting position of the chip mounting substrate is in a field of view of the substrate position recognizing camera.

2. The chip mounting apparatus as claimed in claim 1, wherein the substrate holding member is an X-Y table which is movable in the X and Y directions independently of the arm member of the X-Y robot.

* * * * *